(12) United States Patent
Bannwarth et al.

(10) Patent No.: US 10,209,294 B2
(45) Date of Patent: Feb. 19, 2019

(54) METHOD FOR PRODUCING AN ARC DETECTION SIGNAL AND ARC DETECTION ARRANGEMENT

(71) Applicant: TRUMPF Huettinger GmbH + Co. KG, Freiburg (DE)

(72) Inventors: Markus Bannwarth, Freiburg (DE); Christian Fritsch, Waldkirch (DE); Ulrich Heller, Guendlingen (DE); Daniel Krausse, Eichstetten (DE); Rolf Merte, Freiburg (DE); Moritz Nitschke, Freiburg (DE); Peter Wiedemuth, Herbolzheim (DE); Christian Bock, Freiburg (DE); Michael Glueck, Freiburg (DE); Thomas Kirchmeier, Teningen (DE); Ekkehard Mann, Gundelfingen (DE); Krishna Kishore Nedunuri, Soest (DE); Martin Steuber, Freiburg (DE); Markus Winterhalter, Bad Krozingen (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 1006 days.

(21) Appl. No.: 14/097,428

(22) Filed: Dec. 5, 2013

(65) Prior Publication Data
US 2014/0159741 A1    Jun. 12, 2014

Related U.S. Application Data

(63) Continuation of application No. PCT/EP2012/060707, filed on Jun. 6, 2012.

(30) Foreign Application Priority Data

Jun. 7, 2011    (DE) .................. 10 2011 077 152

(51) Int. Cl.
*G01R 31/24*    (2006.01)
*H01J 37/32*    (2006.01)

(52) U.S. Cl.
CPC ........ *G01R 31/24* (2013.01); *H01J 37/32944* (2013.01)

(58) Field of Classification Search
CPC ........................ G01R 31/24; H01J 37/32944
See application file for complete search history.

(56) References Cited

U.S. PATENT DOCUMENTS

| 4,246,642 A | 1/1981 | Magill |
| 6,332,961 B1 | 12/2001 | Johnson et al. |

(Continued)

FOREIGN PATENT DOCUMENTS

| DE | 102007056468 A1 | 6/2009 |
| WO | WO1999014394 A1 | 3/1999 |
| WO | WO2008150136 A1 | 12/2008 |

OTHER PUBLICATIONS

International Preliminary Report on Patentablity and Written Opinion for corresponding PCT Application No. PCT/EP2012/060707, dated Dec. 10, 2013, 10 pages.

(Continued)

*Primary Examiner* — David M. Gray
*Assistant Examiner* — Michael A Harrison
(74) *Attorney, Agent, or Firm* — Fish & Richardson P.C.

(57) ABSTRACT

A method for producing an arc detection signal on the basis of a plurality of observation signals comprises producing an arc detection part-signal for each of at least two observation signals. Producing each of the part-signals includes correlating the respective observation signal with a correlation signal by influencing the correlation signal with the respective observation, thereby producing a correlation result; producing or modifying a coefficient on the basis of the (Continued)

correlation result; and weighting the respective observation signal with the coefficient. The arc detection part-signals are added to form the arc detection signal.

16 Claims, 5 Drawing Sheets

(56) References Cited

U.S. PATENT DOCUMENTS

| | | | |
|---|---|---|---|
| 6,535,785 B2 * | 3/2003 | Johnson | H01J 37/32082 156/345.28 |
| 7,305,311 B2 | 12/2007 | van Zyl | |
| 8,018,243 B2 | 9/2011 | Mann et al. | |
| 2006/0241879 A1 | 10/2006 | van Zyl | |
| 2008/0061793 A1 | 3/2008 | Anwar et al. | |
| 2008/0121517 A1 | 5/2008 | Nitschke | |
| 2009/0207537 A1 | 8/2009 | Coumou | |
| 2009/0284265 A1 | 11/2009 | Ohta et al. | |

OTHER PUBLICATIONS

Siregar, Edouard, "Agent Discovery as Critical Dynamics of a Topological Space: NASA-AISRP TOFU project NASW-00043 AISRP 03", Pittsburgh and Carnegie Mellon University, Pittsburgh, PA, 2003.
International Search Report from corresponding PCT Application No. PCT/EP2012/060707, dated Jan. 7, 2013, 6 pages.

\* cited by examiner

METHOD FOR PRODUCING AN ARC DETECTION SIGNAL AND ARC DETECTION ARRANGEMENT

TECHNICAL FIELD

The invention relates to a method for producing an arc detection signal on the basis of a plurality of observation signals and an arc detection arrangement of a plasma system for producing an arc detection signal.

BACKGROUND

A plasma is a particular aggregate state which is produced from a gas. Each gas comprises in principle atoms and/or molecules. In a plasma, this gas is to a large degree ionized. This means that, by supplying energy, the atoms or molecules are split into positive and negative charge carriers, that is to say, into ions and electrons. A plasma is suitable for processing workpieces since the electrically charged particles are chemically highly reactive and can additionally be influenced by electrical fields. The charged particles can be accelerated by means of an electric field onto an object where they can release individual atoms therefrom upon impact. The released atoms can be conveyed away by means of gas flow (etching) or be deposited on other objects as a coating (production of thin films). Such a processing operation using a plasma is used in particular when extremely thin layers, in particular in the region of a few atom layers, are intended to be processed. Typical applications are semi-conductor technology (coating, etching, etc.), flat screens (similar to semi-conductor technology), solar cells (similar to semi-conductor technology), architectural glass coating (heat protection, anti-glare protection, etc.), storage media (CD, DVD, hard disks), decorative layers (colored glasses, etc.) and tool hardening. These applications have high demands in terms of precision and process stability. Furthermore, a plasma can also be used for the excitation of lasers, in particular gas lasers.

In order to generate a plasma from a gas, energy must be supplied to it. This can be carried out in different manners, for example, by means of light, heat, electrical energy. A plasma for processing workpieces is typically ignited in a plasma chamber and maintained. To this end, a noble gas, for example, argon, is directed into the plasma chamber at low pressure. By means of electrodes and/or antennae, the gas is subjected to an electrical field. A plasma is produced or is ignited when a plurality of conditions are fulfilled. Firstly, a small number of free charge carriers must be present, with the free electrons which are always present in a very small quantity being used in most cases. The free charge carriers are so powerfully accelerated by the electrical field that they release further electrons upon impact with atoms or molecules of the noble gas, whereby positively charged ions and additional negatively charged electrons are produced. The other free charge carriers are again accelerated and produce other ions and electrons upon impact. An avalanche effect is produced. The occurrences of discharge during the collision of these particles with the wall of the plasma chamber or other objects and the natural recombination counteract the constant production of ions and electrons, that is to say, electrons are attracted by ions and recombine to form electrically neutral atoms or molecules. Therefore, energy has to be supplied to an ignited plasma continuously in order to maintain it.

The energy supply can be carried out by means of a direct current (DC) power supply or an alternating current (AC) power supply. The frequencies which occur during plasma excitation with an AC power supply may be as high as in the gigahertz range.

In the plasma, brief and also longer-lasting flashes may occur, so-called arcs, which are undesirable. When such an arc is detected, it must be ensured that it is extinguished in the most rapid manner possible or does not fully develop.

In a plasma process, various signals can be used for arc detection and have corresponding indications for an arc, for example, the reflected power, the relationship of reflected power to forward power, current, voltage, phase angle, brightness of the plasma, optionally at one or more specific optical wavelengths, acoustic signals, DC bias which is produced, signals from an antenna in the plasma chamber, etc. Mathematical operations on these signals (for example, consideration of the slope by differentiating a signal, filtering) can increase the sensitivity.

The arc detection with fixed threshold values is often either not secure enough or too stringent. Furthermore, it is not flexible enough to react to changing operating parameters.

SUMMARY

An object of the present invention is to provide a method and a device by means of which arcs can be detected in a more reliable manner.

This object is achieved with a method for producing an arc detection signal on the basis of a plurality of observation signals and having the method steps:

a. production of an arc detection part-signal for each of at least two observation signals, the production of each arc detection part-signal comprising:

i. correlation of the associated observation signal or a modified observation signal with a correlation signal by the correlation signal being influenced with the respective observation signal or modified observation signal and a correlation result thus being produced, ii. production or modification of a coefficient on the basis of the correlation result;

iii. weighting of the respective observation signal with an associated coefficient;

b. addition of the arc detection part-signals to form the arc detection signal.

Owing to the appropriate joining together (combination) of observation signals in a combiner to form a common arc detection signal, the speed and reliability of the arc detection can be increased. With the method according to the invention, it is in particular possible to allow such a combination of signals to form an arc detection signal to be carried out automatically (self-learning) in such a manner that the coefficients during the addition lead to a better signal/noise ratio. Preferably, a separate coefficient is associated with each observation signal so that the observation signal or the resulting arc detection part-signal can be weighted with a separate coefficient and can be incorporated in the arc detection signal with this weighting.

As a correlation signal, it is possible to use a signal which is related to a previously established arc detection signal. In particular, the correlation signal, for example, an electrical signal, in the event of arc detection may have a clear modification of the signal characteristic with respect to a signal characteristic without arc detection.

A correlation signal may also be an arc detection signal which establishes the arc detection in an independent manner, for example, by means of an observation signal which is independent of the arc detection arrangement which is yet to be described. This could, for example, be a signal which is generated by an optical or acoustic monitoring system in the plasma chamber.

Furthermore, a correlation signal may be an externally produced signal which brings about or simulates an arc behavior in the plasma system. For example, an external signal producer may feed an energy-rich impulse into the plasma. This impulse could be produced by a signal generator. The output of the signal generator, the impulse itself or filtered or modified signals of these signals could be used as correlation signals.

The correlation signal may be multiplied with the observation signal or a modified observation signal.

A modified observation signal is intended to be understood, for example, to refer to a signal which is obtained when the observation signal is compared with a threshold, only one signal being emitted as a modified observation signal when the threshold is exceeded. Alternatively, the observation signal may be provided or filtered with non-linearity in order to obtain a modified observation signal.

According to a method variant, there may be provision for the correlation result to be multiplied with a factor. According to a method variant, there may be provision for the correlation result which is multiplied with a factor to be added with the correct preceding sign to the coefficient in order to form an updated coefficient. The factor in this instance preferably has values of less than one. In principle, it is conceivable to keep the factor constant, a separate factor being able to be associated with each coefficient.

There may further be provision for the factor to become increasingly small, the longer a plasma process runs (in this instance, this may, for example, be a learning process). In particular, the factor may decrease over time in accordance with a predetermined provision. The smaller the factor becomes, the more stable the coefficients are kept. The factor may thus be variable. It is further conceivable for the factor to be set to zero after a specific time.

If the factor remains different from zero, it is also possible to adapt the weighting of the observation signals permanently during continuous operation of a plasma process.

The method according to the invention is distinguished in that the coefficients for the observation signals increase more rapidly with high degrees of irregularity (strong indicators that an arc is present). Such signals are then incorporated more powerfully, that is to say, with higher weighting into the arc detection signal. Arc detection thereby becomes increasingly reliable.

Advantageously, a start coefficient can be predetermined for each observation signal. For example, for an observation signal, in which it is relatively highly probable that an irregularity will occur when an arc occurs, the coefficient can be set to be equal to one. This means that this observation signal alone initially forms the arc detection signal. If an event occurs which indicates an arc, an irregularity is sought in all other signals as an indicator that an arc has also been observed in this signal, that is to say, the arc has led to an irregularity in the signal. The coefficients which have been associated with these signals are then updated by the irregularity multiplied by the factor. If the irregularity was negative, the coefficient is reduced. If the irregularity was positive, the coefficient is increased. The coefficient thus constitutes an integrator whose content may increase or decrease slightly with each detected arc.

According to a method variant, there may be provision for the correlation signal to be an arc detection signal, in particular an arc detection signal which is generated previously or independently of the method according to the invention. Accordingly, the arc detection signal can be incorporated directly into the renewal or updating of the coefficients. With a stepless consideration, the arc detection signal can be constantly multiplied with the observation signal which has the irregularities in order to be able to renew the corresponding coefficient with this result. For reasons of stability, a small factor should be ensured in this instance. However, it is also conceivable for the arc detection signal to be supplied to a decision member and for the output signal of the decision member to be used as a correlation signal. The decision member may, for example, be an arc detector which decides, based on the arc detection signal, whether an arc is present or not. The output signal of the arc detector may be used as a correlation signal.

In place of a simple decision process involving arc/no arc, a softer decision can be carried out with a plurality of steps or also a stepless consideration/evaluation of the arc detection signal. The multiplication or renewal of the coefficients can be made dependent on the arc detection signal exceeding/falling below one or more thresholds. In particular, although a "small" arc event detected in the arc detection signal may initiate the arc measure provided for in the plasma installation, the coefficients can be renewed only by a sufficiently large arc event. To this end, in the decision member, the arc detection signal can be compared with one or more thresholds. Alternatively, the arc detection signal may be provided with an offset and/or a non-linearity can be applied to the arc detection signal. The resulting signal then constitutes the correlation signal. For example, the arc detection signal can be squared and the squared signal can be used as a correlation signal in order to renew the coefficients.

At least one observation signal can be compared with at least one threshold or a non-linearity can be applied to the observation signal before it is correlated with the correlation signal. In this manner, regions of the observation signal may be evaluated differently and an appropriate evaluation may be carried out.

In order to ensure the stability of the system, at least one coefficient can be limited. Preferably, all the coefficients are limited, that is to say, there is predetermined for all coefficients a value, or there is predetermined for each coefficient a separate value, which it must not exceed.

The coefficients may also be normalized, for example, with the sum of the absolute values thereof. By means of individual consideration of the coefficients or by means of individual corrections of the normalized coefficients (multiplication with a factor, offset), specific observation signals may be intentionally undervalued or overvalued.

There may further be provision for at least one coefficient to be acted on with a shrinkage. This means that the coefficients are reduced at defined times or events. For example, coefficients, in the case of no or excessively low irregularities (which indicate an arc) of the associated observation signal, can be drawn towards zero. The shrinkage may be an absolute or relative shrinkage. It may, for example, act with each detected arc. However, the shrinkage is intended to be selected to be so small that a sufficiently large irregularity in the case of an arc influences the coefficient more rapidly or more powerfully than the shrinkage. The shrinkage may be different for different observation signals.

At least one observation signal may be produced by a measurement signal being amplified, filtered, differentiated according to time, normalized with the noise thereof and/or mathematically processed. In order to achieve an optimal signal/noise ratio, the observation signals can be normalized with their noise before entering the combiner.

There may be further provision for at least one observation signal to be weighted with a plurality of coefficients. In place of a single coefficient for each observation signal, a series of m coefficients can be used (m can be selected to be of a different size for different observation signals depending on requirements). It is also possible for each (or at least one) observation signal to have a time-delay line with m-1 cells (time-delay members). This means that the at least one observation signal can be weighted with a coefficient in accordance with different time delays. In particular, the sum can be formed from the m coefficients multiplied with the respective corresponding time-delayed observation signal. This can be carried out for all or at least one observation signal.

For the renewal of one of the m coefficients in the case of a detected arc, the signal amplitude present in the corresponding time-delay member (irregularity) is decisive. For each of the observation signals, the coefficients in whose associated time-delay member the largest irregularity of the observation signal occurs may increase most rapidly. However, an arc detection takes place only when the irregularities in an arc encounter the higher coefficients, that is to say, at the latest after m cycles.

In order to ensure the temporal stability, the flanks of the time-delay chain of the combiner may, for example, be evaluated to be smaller than the center. In this manner, the main proportion of the weightings will appear at the centers of the time-delay lines, that is to say, in the central time-delay members, which determines the temporal relation.

If the irregularities anticipated in an arc are time-delayed with respect to each other in two observation signals, the m coefficients for these two observation signals will also reflect this time-delay and thus lead to a temporally more narrowly defined event on the arc detection signal.

An irregularity which is expanded or which is provided with a specific form on an observation signal will also lead to m coefficients, which illustrate this input signal in an optimum manner on a temporally more narrow event on the arc detection signal.

The scope of the invention further includes an arc detection arrangement of a plasma system for producing an arc detection signal, having a combiner, to which a plurality of observation signals are supplied, comprising:

a. at least two arc detection part-signal generators, to each of which an observation signal is supplied, each having:
  i. a multiplier for multiplication of the observation signal with a coefficient;
  ii. a correlator for correlation of the observation signal with a correlation signal;
  iii. a coefficient producer which is connected to the correlator and the multiplier;
b. an adder, to which the arc detection part-signals are supplied and which outputs the arc detection signal.

With such an arc detection arrangement, it is possible to allow a combination of signals to form a detection signal to be carried out automatically (in a self-learning manner) in such a manner that the weightings (coefficients) in the addition lead to a better signal/noise ratio. The speed of the arc detection is thereby increased.

The coefficient producer may comprise an integrator. The output of the coefficient producer, that is to say, the coefficient, can consequently increase or decrease slightly with each detected arc.

There may further be provided a normalizing member, to which the coefficients are supplied and whose output is connected in each case to a multiplier in the coefficient producers. Owing to a normalization, the signal/noise ratio can be improved.

There may be arranged downstream of the combiner a decision member whose output is supplied to the correlators. The decision member may, for example, be the actual arc detector. A change of the coefficients is accordingly carried out only when an arc has been detected. However, it is also conceivable for other decision members to be provided so that a signal is supplied to the correlators only when specific events occur.

At least one arc detection part-signal generator may have a plurality of time-delay members, correlators and coefficient producers. Time differences can thereby be compensated for.

Other features and advantages of the invention will be appreciated from the following description of embodiments of the invention, with reference to the Figures of the drawings, which show inventively significant details, and the claims. The features set out therein are not necessarily intended to be understood to be to scale and are illustrated in such a manner that the particular features according to the invention may have been made clearly visible. The individual features can be implemented individually together or in any combination in variants of the invention.

The details of one or more embodiments of the invention are set forth in the accompanying drawings and the description below. Other features, objects, and advantages of the invention will be apparent from the description and drawings, and from the claims.

Embodiments of the invention are illustrated in the schematic drawings and explained in greater detail in the following description.

DESCRIPTION OF DRAWINGS

FIG. 4 is a schematic illustration of a portion of an arc detection arrangement, by means of which time delays can be compensated for;

DETAILED DESCRIPTION

Figure 1:
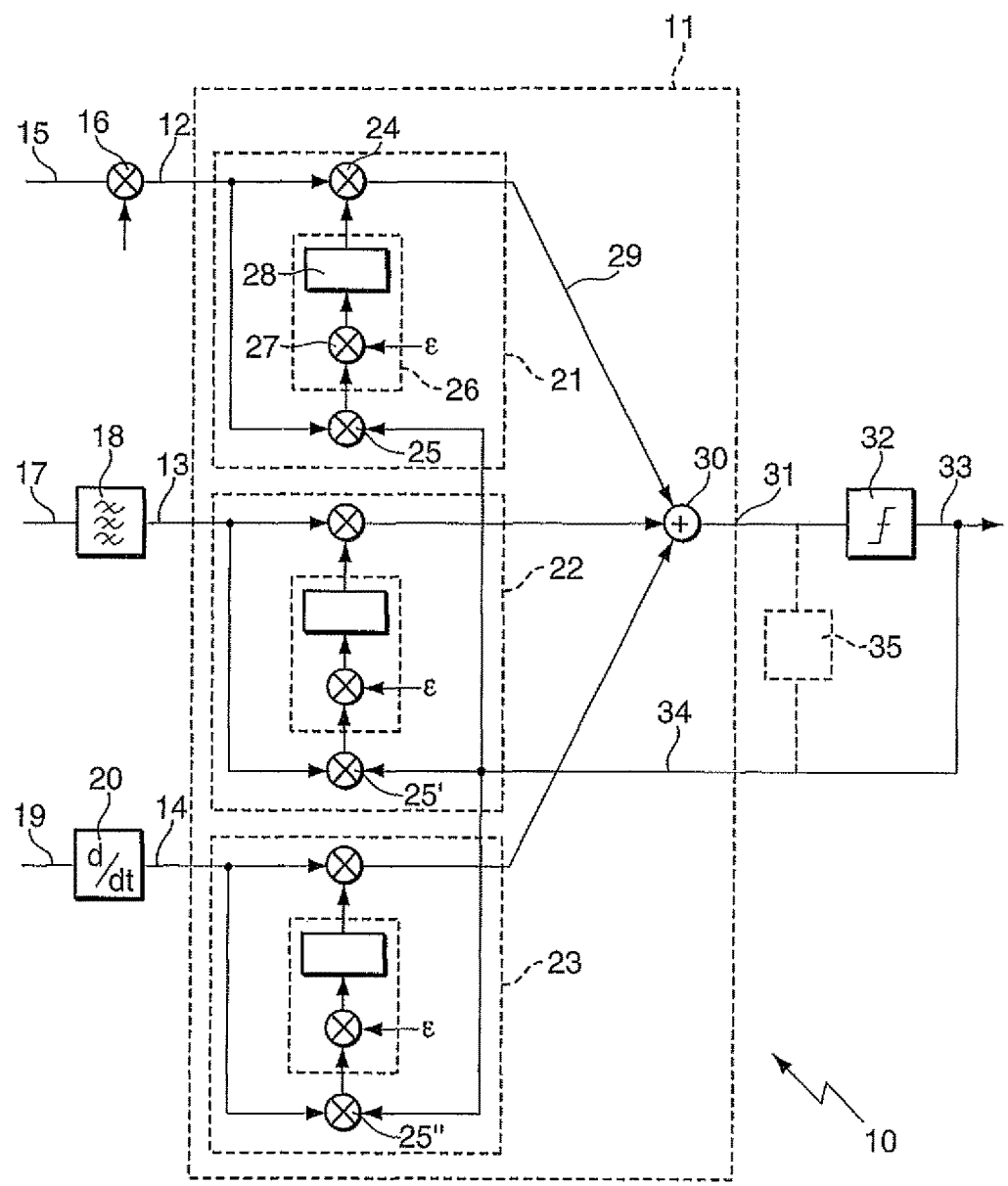
FIG. 1 is a schematic illustration of a first embodiment of an arc detection arrangement.

FIG. 1 shows a first embodiment of an arc detection arrangement 10. The arc detection arrangement 10 has a combiner 11, to which three observation signals are supplied on the lines 12, 13, 14 in the embodiment shown. The observation signals which are supplied on the lines 12, 13, 14 may directly constitute measurement signals. In the embodiment shown, however, a measurement signal is supplied to a preamplifier 16 on the line 15. The observation signal supplied on the line 12 is produced therefrom.

On the line 17, a measurement signal is supplied to a prefiltering unit 18. The output signal of the prefiltering unit 18 is the observation signal, which is supplied to the combiner 11 on the line 13.

On the line 19, a measurement signal is supplied to a differentiating member 20 which carries out a time differentiation of the measurement signal. The result of the time differentiation is supplied to the combiner 11 as an observation signal on the line 14.

In the embodiment shown, the combiner 11 has three arc detection part-signal generators 21, 22, 23. This means that an arc detection part-signal generator 21-23 is provided for each observation signal. In the embodiment shown, all the arc detection part-signal generators 21-23 are constructed in an identical manner. Therefore, only the arc detection part-signal generator 21 is explained in greater detail below.

The observation signal is supplied via the line 12 to a multiplier 24 in order to multiply the observation signal with a coefficient. Furthermore, the observation signal is supplied to a correlator 25 for correlation, in particular multiplication, of the observation signal with a correlation signal. The result of the correlator is supplied to a coefficient producer 26. In the coefficient producer 26, there is arranged another multiplier 27 in which the correlation result is multiplied with a factor $\varepsilon$. The result of this multiplication is supplied to an integrator 28, whose output sets out the coefficient which is supplied to the multiplier 24. The result of the multiplication in the multiplier 24 is supplied on the line 29 to an adder 30 as an arc detection part-signal. The arc detection part-signals which have been produced in the arc detection part-signal generators 21-23 are added to the adder 30. An arc detection signal is therefore output on the line 31. The arc detection signal is supplied to a decision member 32, which analyses the arc detection signal and decides, for example, by comparing the arc detection signal with a threshold, whether or not an arc is present.

In the embodiment shown, there is provision for the arc signal on the line 33 to be supplied via the line 34 to the correlators 25 of the arc detection part-signal generators 21-23. The arc signal is therefore the correlation signal in the present embodiment. Alternatively, it would be conceivable to provide an additional decision member 35, which is indicated here only with broken lines, in which a threshold other than the arc detection threshold is used. The output of this decision member 35 could alternatively be supplied on the line 34 to the correlators 25 as a correlation signal.

During a learning phase, the coefficients which are supplied to the multipliers 24 can each first be predetermined. If, for example, a measurement signal in which an arc undoubtedly brings about an irregularity is supplied on the line 15, that is to say, an arc can be detected with reference to the measurement signal, the coefficient which is supplied to the multiplier 24 can be set to 1. For the other observation signals, which are supplied on the lines 13, 14, the coefficient can accordingly be set to zero. In this instance, the arc detection part-signal which is supplied to the adder 30 on the line 29 forms the arc detection signal alone. If an event (irregularity) which indicates an arc occurs in the measurement signal or observation signal which is supplied on the line 12, an arc signal is output on the line 33. In this case, the coefficient is renewed since a correlation signal is supplied to the correlators 25 on the line 34. If the observation signals on the lines 13, 14 also contain an irregularity which indicates an arc, this irregularity is multiplied with the correlation signal in the correlators 25', 25". The coefficients for these signals are consequently renewed and multiplied by the irregularity with a small factor $\varepsilon$. If the irregularity was negative, the coefficient is corrected by a negative value; if the irregularity was positive, the correction is carried out in a positive direction. The coefficient thus constitutes the result of an integration whose value may increase or decrease slightly with each detected arc. For the further detection, all the observation signals are multiplied with their coefficients and added to the arc detection signal. Of course, the coefficient which is supplied to the multiplier 24 is also corrected.

This process is carried out continuously and leads to arc detection which becomes increasingly reliable by the coefficients for observation signals increasing more rapidly with high degrees of irregularity in the event of indications of an arc. The factor $\varepsilon$ with which the coefficients are influenced (renewed) can be made increasingly small over a period of time in order to maintain the coefficients in an increasingly stable state. If the factor $\varepsilon$ remains different from zero, it is also possible during continuous operation, that is to say, during a plasma process operation, for the weighting of the observation signals to be permanently adapted. The factor $\varepsilon$ can be reduced not only during continuous stabilization of the coefficients, but may also be different for various observation signals.

If coefficients for the arc detection part-signal generators 21-23 are already known from a previous process, they can be used as initial values for the learning phase. In order not to damage any material which is to be processed, it is possible, for example, to carry out a plasma process which acts only as the learning phase, the plasma chamber containing only dummy material.

The detection threshold for arcs in the decision member 32 can be adapted to the constantly improving signal/noise ratio of the arc detection signal.

It is further conceivable, in place of using the output 33 as a correlation signal, to use the decision member 35 in order to produce a correlation signal. In place of a simple decision process involving arc/no arc, a softer decision with a plurality of steps can consequently take place. The plurality of steps may initiate different factors for the renewal of the coefficients. In a stepless consideration, the arc detection signal which is output on the line 31 is constantly multiplied with the observation signal which has irregularities in order to renew the corresponding coefficient with this result. This case would thus correspond to a direct connection of the line 31 to the line 34. For reasons of stability, a small factor $\varepsilon$ must be ensured in this instance. The thresholds which are set in the decision path 35 may also be higher than the arc detection threshold in the decision member 32. Although an arc event detected in the arc detection signal can consequently initiate the arc suppression measures provided in the installation, the coefficients can be renewed only in the case of a (more powerful) arc event, that is to say, only when the threshold in the decision member 35 is exceeded. In particular, a correlation signal can be produced only in this instance.

Figure 2:
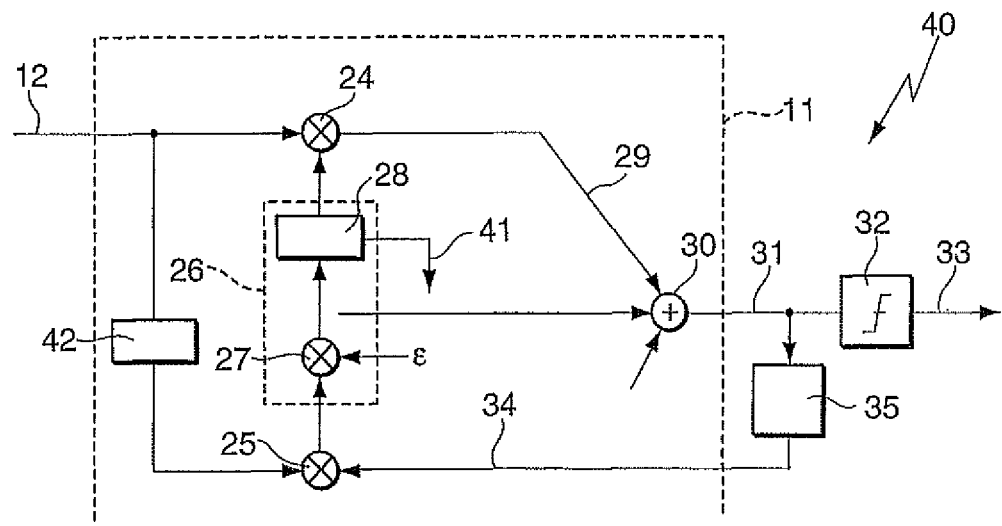
FIG. 2 is a second embodiment of an arc detection arrangement.

FIG. 2 shows another embodiment of an arc detection arrangement 40, elements which correspond to those of FIG. 1 being given the same reference numerals. In this instance, the integrator 28 has a shrinkage 41. This results in the coefficient which is output by the coefficient producer 26, in the event of no or excessively small irregularities in the observation signal on the line 12, being drawn towards zero. The shrinkage may be absolute or relative. For example, the shrinkage may act with each detected arc. However, it should be selected to be so small that a sufficiently large irregularity in the event of an arc influences the coefficient more rapidly than the shrinkage. The shrinkage may be different for different observation signals.

There is further shown in FIG. 2 a member 42 which modifies the observation signal before it is supplied to the multiplier 25. For example, in the member 42, the observation signal may be compared with a threshold and a signal may be output only when the threshold has been exceeded. Alternatively, the observation signal may be provided with a non-linearity or a filter.

In FIG. 2, there is further provision for the correlation signal to be produced by means of the decision member 35. The arc signal on the line 33 is consequently not used in this instance as a correlation signal. In the decision member 35, the arc detection signal which is output on the line 31 can be compared with a threshold, a threshold with offset or a plurality of thresholds, or be provided with a non-linearity, for example, a squaring. Other measures for modification of the arc detection signal for conversion into a correlation signal are also conceivable.

All the embodiments described in FIG. 2, such as the integrator 28, a shrinkage 41, the modified member 42 or the decision member 35, can expand the arc detection arrangement 10 individually or in any combination.

Figure 3:
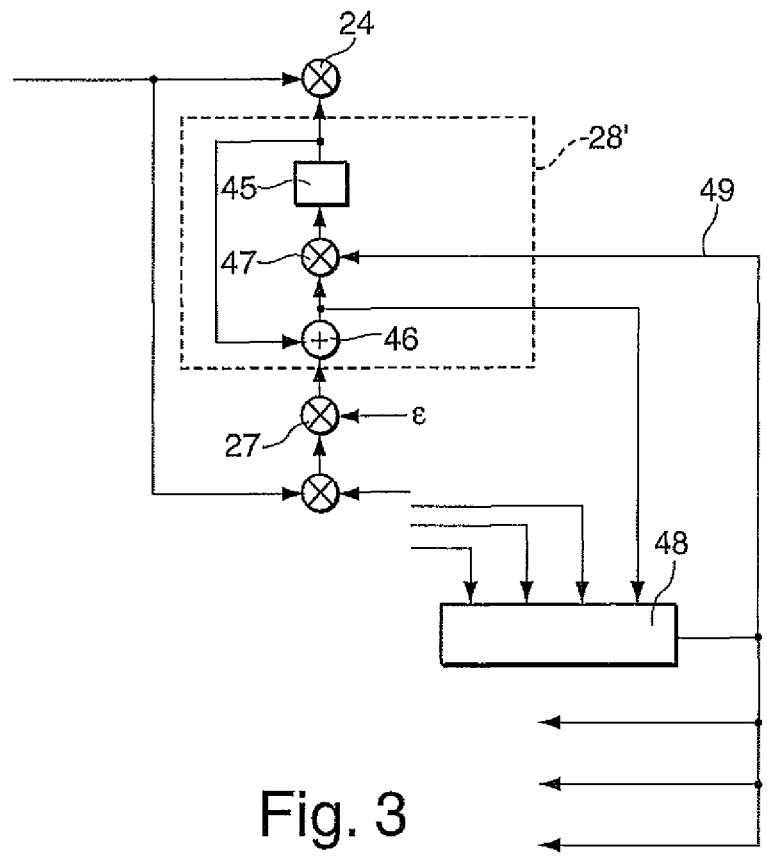
FIG. 3 is a schematic illustration to explain a normalization of the coefficients.

FIG. 3 shows the possibility of standardizing the coefficients. In particular, the coefficient producer 26' was modified in comparison with the previous embodiments. The integrator 28' has a register 45, which, however, constitutes only a store, not a time delay. The output of the register 45 is supplied, on the one hand, to the multiplier 24 and, on the other hand, to an adder 46. The multiplication result of the multiplier 27 is further supplied to the adder 46. The addition result of the adder 46 is, on the one hand, supplied to a multiplier 47 and, on the other hand, to a normalization member 48. The coefficients of the other arc detection part-signal generators are also supplied to the normalization member 48, which is indicated with the arrows 36. For example, the sum of the absolute values of all coefficients can be formed in the normalization member 48. This value is then supplied back to the multiplier 47 via the line 49, where a multiplication with the coefficient output by the adder 46 takes place. The result is written to the register 45 and supplied to the multiplier 24. The normalization factor, that is to say, the output of the normalization member 48, is also supplied to the other arc detection part-signal generators, in order to normalize the respective coefficients, which is indicated with the arrows 37.

Figure 4:
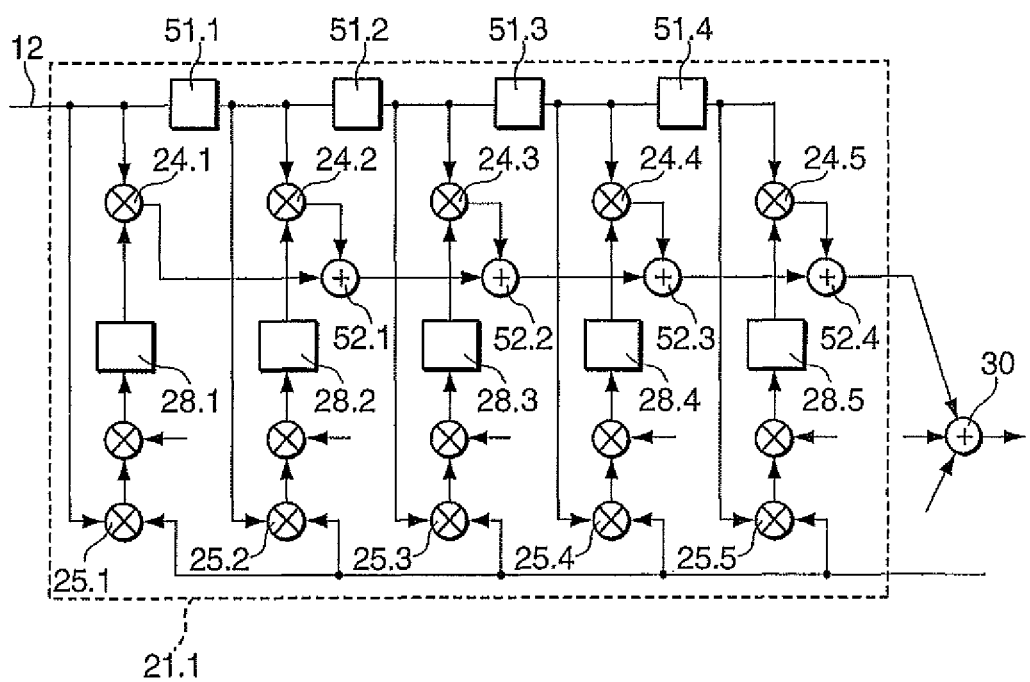

FIG. 4 shows an embodiment in which, in place of a single coefficient for each observation signal of the combiner, a series of coefficients are used in order to compensate for time differences between the observation signals. In the embodiment shown, the arc detection part-signal generator 21.1 accordingly has five multipliers 25.1, 25.2, 25.3, 25.4, 25.5, to which a correlation signal is supplied. The observation signal on the line 12 is further supplied to the multiplier 25.1. The observation signal further reaches time-delay members 51.1, 51.2, 51.3 and 51.4. The observation signal which is delayed by a cycle therefore reaches the multiplier 25.2, the observation signal which is delayed by two cycles reaches the multiplier 25.3, the observation signal which is delayed by three cycles reaches the multiplier 25.4 and the observation signal which is delayed by four cycles reaches the multiplier 25.5. The multiplication results of the multipliers 25.1-25.5 are multiplied in the multipliers 27.1-27.5 with the factor ε and then supplied to the respective integrators 28.1-28.5. The coefficients produced therein are in turn supplied to the multipliers 24.1-24.5. The results of the multiplications are added in adders 52.1-52.4, the output of the adder 52.4 outputting the arc detection part-signal which is supplied to the adder 30.

The arc detection part-signal generator 21.1 constitutes an FIR filter. The other arc detection part-signal generators of the combiner may also generate five coefficients or also generate a different number of coefficients and with reference to these coefficients produce an arc detection signal. For the renewal of one of the coefficients in the case of a detected arc, the signal amplitude (irregularity) which is present in each case in the corresponding time-delay member 51.1-51.4 is decisive. However, an arc detection takes place only when the irregularities in an arc encounter the higher coefficients, that is to say, after five cycles at the earliest. If the irregularities anticipated with an arc in the observation signal are time-delayed with respect to each other in the case of two observation signals, the coefficients for these two observation signals will also reflect this time delay and thus lead to a temporally more narrowly defined event on the arc detection signal. An irregularity which is expanded or which is provided with a specific form on an observation signal will also lead to coefficients which map this observation signal in an optimum manner on a temporally narrower event on the arc detection signal.

FIGS. 5a to 5d illustrate four observation signals 100, 102, 104, 107. Each of these signals is connected to an arc part-signal generator 21.1, as illustrated in FIG. 4, respectively. The observation signal 100 has in the region of the time 500 a twin peak 101. This twin peak 101 constitutes an irregularity which indicates an arc. This irregularity is positive.

Figure 5A:
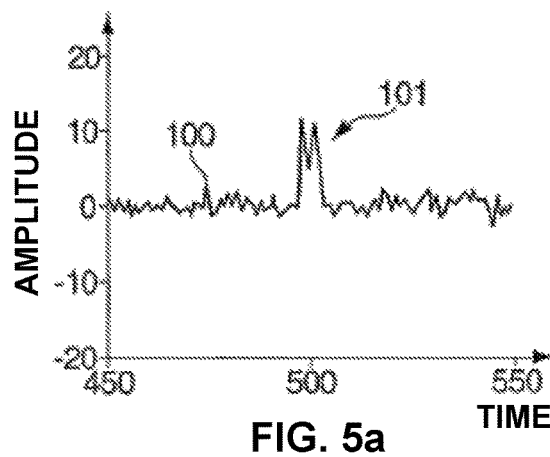
FIGS. 5a to 5d each show an observation signal.
Figure 5B:
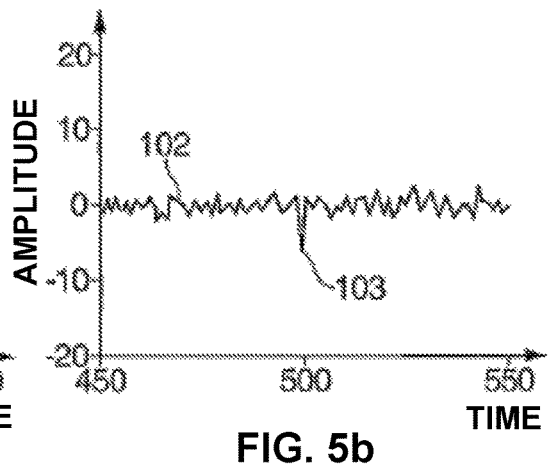

FIG. 5b illustrates an observation signal 102 which has a negative peak 103 in the region of the time 500.

Figure 5C:
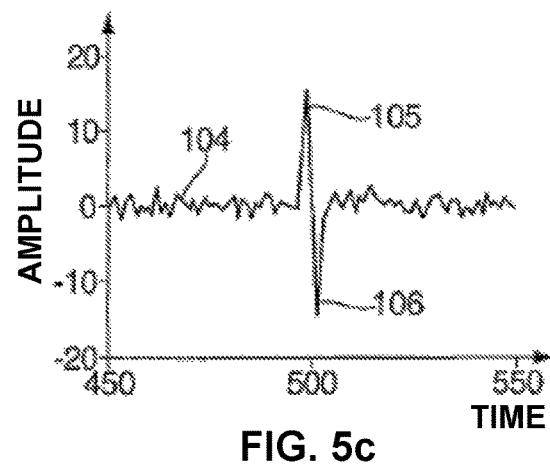

The observation signal 104 which is shown in FIG. 5c has both a positive amplitude 105 and a negative amplitude 106 in the region of the time 500.

Figure 5D:
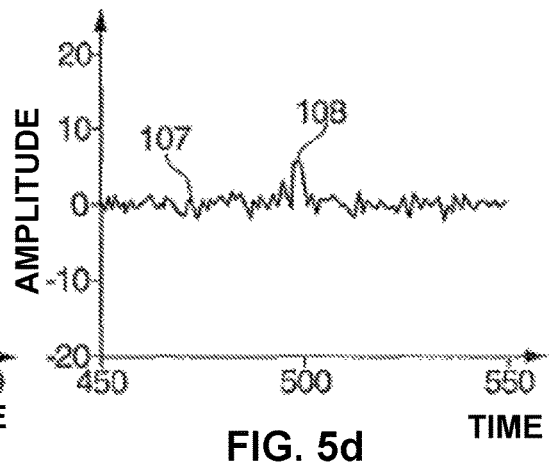

The observation signal 107 of FIG. 5d has only a non-sharp, that is to say, not clearly defined, irregularity 108.

Figure 5E:
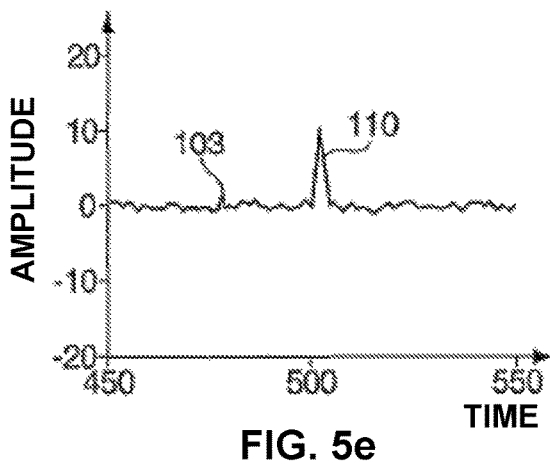
FIG. 5e shows an arc detection signal.

FIG. 5e shows the arc detection signal which was produced taking into account the observation signals 100, 102, 104, 107. In the region 500, a clear amplitude 110 can be seen.

Figure 5F:
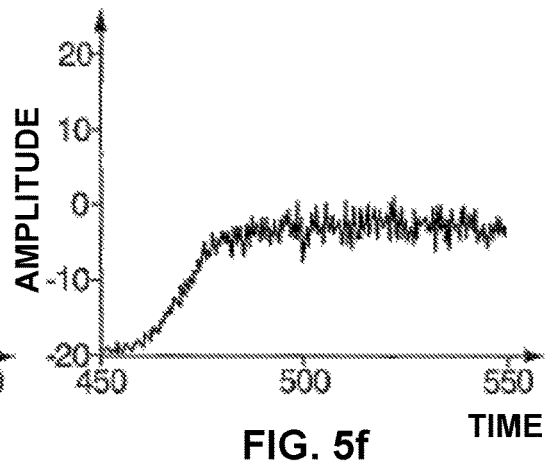
FIG. 5f shows the signal/noise ratio of the arc detection signal of FIG. 5e.

FIG. 5f shows on the normalized time axis, with an arc event being illustrated for each X step, the increase of the signal/noise ratio of the arc detection signal over time.

FIGS. 6a to 6d show the progression of the coefficients which is produced for the observation signals 100, 102, 104, 107 shown in FIGS. 5a to 5d. The observation signal 100 from FIG. 5a produces the coefficients 60.1 to 60.5 in FIG. 6a. If it is assumed that the observation signal 100 in FIG. 4 was supplied on the line 12, then the coefficients 60.1 to 60.5 would be the output signals of the integrators 28.1-28.5. All the coefficients are set to zero at the beginning in this instance. After approximately 150 arc events, the coefficients develop. The four coefficients 60.1, 60.2, 60.4, 60.5 increase at substantially the same rate and reach after approximately 300 arc events a static value of approximately 0.5. The mean coefficient 60.3 (corresponds to the output of the integrator 28.3) also reaches a static value of approximately 0.2 after approximately 300 arc events. This substantially corresponds to the line path of the observation signal 100 from FIG. 5a.

Figure 6A:
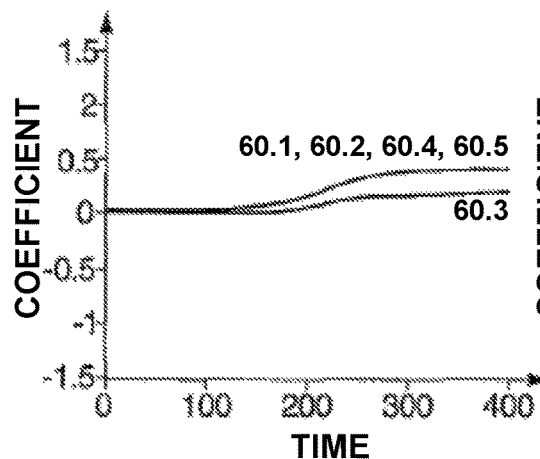
FIGS. 6a to 6d show the progression of the coefficients which is produced for the observation signals shown in FIGS. 5a-5d.
Figure 6B:
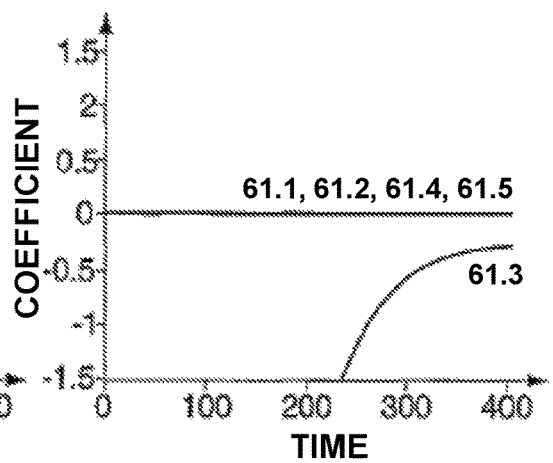

FIG. 6b shows the path of the coefficients 61.1 to 61.5, as they would be present at the output of the integrators 28.1 to 28.5 from FIG. 4 if the observation signal 102 from FIG. 5b were to be applied on the line 12 from FIG. 4. This time the initial value of the coefficient 61.3 was preset to a highly negative value. After approximately 250 arc events, it has increased so far that it can be seen in the graph of FIG. 6b. Only after approximately 400 arc events does it reach a static value of approximately −0.4. The other coefficients remain at their preset value of zero.

Figure 6C:
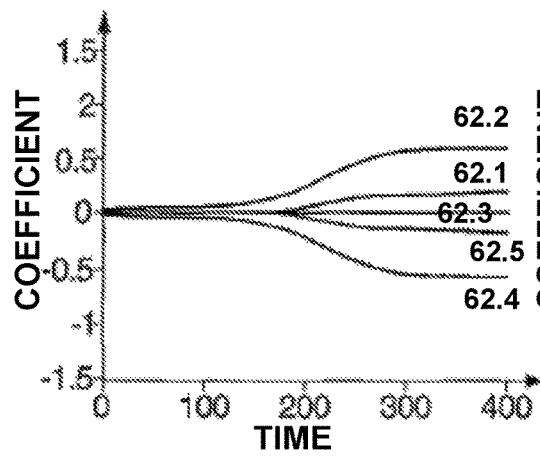

FIG. 6c shows the path of the coefficients 62.1 to 62.5, as they would be present at the output of the integrators 28.1 to 28.5 from FIG. 4 if the observation signal 104 from FIG. 5c were to be applied to the line 12 from FIG. 4. This time, all the initial values of the coefficients 62.1 to 62.5 were preset to zero. The mean coefficient 62.3 (corresponds to the output of the integrator 28.3) remains constant at zero. The first coefficient 62.1 (corresponds to the output of the integrator 28.1) reaches its static value +0.2 after approximately 350 arc events. The second coefficient 62.2 (corresponds to the output of the integrator 28.2) reaches its static value +0.6 after approximately 300 arc events. The fourth coefficient 62.4 (corresponds to the output of the integrator 28.4) reaches its static value −0.6 after approximately 300 arc events. The fifth coefficient 62.5 (corresponds to the output of the integrator 28.5) reaches its static value −0.2 after approximately 350 arc events.

Figure 6D:
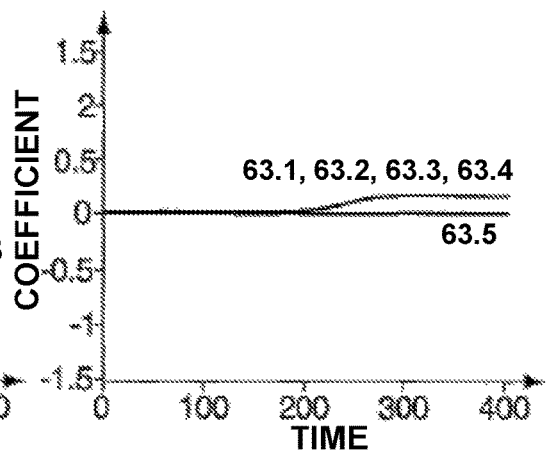

FIG. 6d shows the path of the coefficients 63.1 to 63.5, as they would be applied at the output of the integrators 28.1 to 28.5 from FIG. 4 if the observation signal 107 from FIG. 5b were to be applied to the line 12 from FIG. 4. The mean coefficient 63.3 (corresponds to the output of the integrator 28.3) reaches its static value +0.2 after approximately 300 arc events. The first, the second and the fourth coefficient 63.1, 63.2, 63.4 develop in a similar manner to the mean coefficient. Only the fifth coefficient 63.5 remains at zero.

If the four observation signals 100, 102, 104, 107 are now each connected to an arc detection part-signal generator, as shown at 21.1 in FIG. 4, and the outputs of these arc detection part-signal generators are joined together at the summing location 30 from FIG. 4, it is possible to establish here a very reliable and constantly improving arc detection signal.

A number of embodiments of the invention have been described. Nevertheless, it will be understood that various modifications may be made without departing from the spirit and scope of the invention. Accordingly, other embodiments are within the scope of the following claims.

What is claimed is:

1. A method of producing an arc detection signal for a plasma system on the basis of a plurality of observation signals, the method comprising:
   producing, by an arc detection system, an arc detection part-signal for each of at least two observation signals, each observation signal being generated based on a respective measurement signal of the plasma system, at least one of the observation signals being generated by the respective measurement signal being amplified, filtered, differentiated according to time, normalized with noise thereof, or mathematically processed, at least one of the observation signals having a corresponding indication for an arc in the plasma system, the production of each arc detection part-signal comprising:
      correlating, by the arc detection system, the respective observation signal or a modified observation signal with a respective correlation signal to produce a correlation result, at least one of the correlation signals being one of a signal related to a previously established arc detection signal, an arc detection signal which establishes an arc detection in an independent manner, and an externally produced signal;
      producing, by the arc detection system, or modifying a respective coefficient for the arc detection part-signal on the basis of the correlation result; and
      weighting, by the arc detection system, the respective observation signal with the respective coefficient to produce the arc detection part-signal; and
   adding, by the arc detection system, the arc detection part-signals to form the arc detection signal for detecting whether an arc is present in the plasma system.

2. The method of claim 1, wherein the correlation result is multiplied with a factor and is added with a correct preceding sign to the coefficient to form an updated coefficient.

3. The method of claim 1, wherein the arc detection signal is supplied to a decision member and an output signal of the decision member is used as the correlation signal for at least one of the observation signals.

4. The method of claim 1, wherein, in a decision member, the arc detection signal is compared with one or more thresholds, provided with an offset and/or a non-linearity that is applied to the arc detection signal.

5. The method of claim 1, wherein at least one modified observation signal is obtained by the respective observation signal being compared with at least one threshold or applied with a non-linearity.

6. The method of claim 1, wherein a size of at least one coefficient is limited.

7. The method of claim 1, wherein the coefficients are normalized.

8. The method of claim 1, wherein at least one coefficient is corrected for selective overvaluation or undervaluation of the observation signal which is weighted therewith.

9. The method of claim 1, wherein at least one coefficient is acted on with a shrinkage.

10. The method of claim 1, wherein at least one observation signal is weighted with a plurality of coefficients.

11. The method of claim 10, wherein at least one observation signal is weighted with the coefficients after different time delays.

12. An arc detection system for a plasma system, the arc detection system comprising a combiner to which a plurality of observation signals are supplied, the combiner comprising:
   at least two arc detection part-signal generators to each of which an observation signal is supplied, each arc detection part-signal generator being configured to generate an arc detection part-signal, each observation signal being generated based on a respective measurement signal of the plasma system, at least one of the observation signals being generated by the respective measurement signal being amplified, filtered, differentiated according to time, normalized with noise thereof, or mathematically processed, at least one of the observation signals having a corresponding indication for an arc in the plasma system, each arc detection part-signal generator comprising:
      a multiplier configured to multiply the observation signal with a coefficient to produce the arc detection part-signal;
      a correlator configured to correlate the observation signal with a respective correlation signal to produce a correlation result, at least one of the correlation signals being one of a signal related to a previously established arc detection signal, an arc detection signal which establishes an arc detection in an independent manner, and an externally produced signal; and
      a coefficient producer which is connected to the correlator and the multiplier and is configured to produce the coefficient based on the correlation result; and an adder connected to each of the arc detection part-signal generators to receive the arc detection part-signals and generate the arc detection signal for detecting whether an arc is present in the plasma system.

13. The arc detection system of claim 12, wherein the coefficient producer comprises an integrator.

14. The arc detection system of claim 12, comprising a normalization member, to which the coefficients are supplied and whose output is connected in each case to a multiplier in the coefficient producers.

15. The arc detection system of claim 12, comprising a decision member arranged downstream of the combiner, the decision member being configured to supply an output to the correlators.

16. The arc detection system of claim 12, wherein at least one arc detection part-signal generator comprises a plurality of time-delay members, correlators and coefficient producers.

* * * * *